United States Patent [19]

Sammet

[11] Patent Number: 5,029,242
[45] Date of Patent: Jul. 2, 1991

[54] GLASS-CERAMIC STRUCTURE AND METHOD FOR MAKING SAME

[75] Inventor: Manfred Sammet, Calw-Stammheim, Fed. Rep. of Germany

[73] Assignee: International Business Machines Corporation, Armonk, N.Y.

[21] Appl. No.: 522,338

[22] Filed: May 10, 1990

[30] Foreign Application Priority Data

May 12, 1989 [EP]  European Pat. Off. ........ 89108540.9

[51] Int. Cl.$^5$ .......................... H05K 1/02; H05K 3/40
[52] U.S. Cl. ..................................... 174/257; 174/264; 264/61; 427/97
[58] Field of Search ...................... 174/52.4, 256, 257, 174/260, 262, 264; 264/58; 427/96, 97

[56] References Cited

U.S. PATENT DOCUMENTS

| | | | |
|---|---|---|---|
| 4,234,367 | 11/1980 | Herron et al. | 156/89 |
| 4,301,324 | 11/1981 | Kumar | 174/68.5 |
| 4,799,983 | 1/1989 | Desai | 156/89 |
| 4,806,188 | 2/1989 | Rellick | 156/89 |

Primary Examiner—William R. Dixon, Jr.
Assistant Examiner—Chris Gallo
Attorney, Agent, or Firm—Ira David Blecker

[57] ABSTRACT

The structure consists of at least one glass-ceramic sheet (1) with holes (3) being filled with a conductive material (4) having a TCE slightly higher than that of the glass-ceramics and having undergone liquid phase sintering at the crystallization temperature of the glass-ceramic material (2) with the solid phase comprising conductive particles (5) and the liquid phase comprising at least a glass (6).

The method comprises the steps of providing a green sheet comprising an organic vehicle and particles of a crystallizable first glass and having via holes, filling the via holes with a paste comprising an organic vehicle, and an inorganic material comprising conductive particles and at least a second glass being low viscous at the sintering temperature, firing the then present structure in a reducing, neutral or slightly oxidizing atmosphere with the temperature being slowly raised to said sintering temperature and slowly cooling the structure.

46 Claims, 1 Drawing Sheet

GLASS-CERAMIC STRUCTURE AND METHOD FOR MAKING SAME

BACKGROUND OF THE INVENTION

The invention relates to a sintered glass-ceramic structure layer having holes filled with conductive material and a method of making such a structure where a green sheet is formed of a mixture containing glass particles and a binder which is cast in a thin layer and dried, the holes are subsequently formed and filled with a conductive paste and finally the green sheet is heated to the sintering temperature of the glass-ceramics.

Glass-ceramic structures or substrates of this kind where however always several green sheets are laminated together prior to sintering, and the method for forming the same are described in U.S. Pat. Nos. 4,301,324 and 4,234,367 (whose teachings are incorporated herein by reference thereto). Sintering in this context means the heating of the substrate where the binder is removed, the glass particles coalesce, crystallize and optionally recrystallize in order to be converted into the most stable crystalline modification with the sintering temperature being the highest applied temperature. The glass consists of $\beta$-spodumene being composed essentially of $Li_2 O \, Al_2O_3 \, . \, 4 \, SiO_2$ and cordierite composed essentially of $2 \, MgO \, . \, 2 \, Al_2O_3 \, . \, 4 \, SiO_2$ glass. The conductive material in these prior art substrates consists of copper that forms the vias and also the conductive patterns on the inner layers of the substrate. With the combination of these materials, i.e. copper and glass-ceramics as used in the prior art, the production of a hermetically sealed substrate was not possible in the sintering process. The mechanical tensions between the copper conductors and the glass-ceramics destroy each connection between these two materials. Therefore in the prior art process provisions are made for not filling completely the via holes with copper and to avoid a connection between the glass-ceramics and the copper vias, which is accomplished by cooling the substrate after sintering at a very small oxygen partial pressure. By that any chemical oxygen bridge connection formed eventually during sintering between the copper metallurgy and the glass-ceramic are decomposed, so that the copper with its coefficient of thermal extension of $17 \times 10^{-6}$ and the glass-ceramics with its coefficient of thermal extension of $3.0 \times 10^{-6}$ are separated from each other. In subsequent heating processes, the copper in the substrate can dilate and contract without mechanical tensions being created between the copper and the glass-ceramic. The considerable disadvantage of this process is the formation of a gap between the copper vias and the glass-ceramic because these gaps allow liquids used in subsequent processes to penetrate into the substrates causing the copper metallurgy to corrode or to make the substrate non-functional. To cure this problem a repair process was installed by which after sintering the gaps are filled with an elastic material, like polyimide.

A method described in the article of R. C. O'Handly with the title "Near-Eutectic Alloy Conductors for Glass-Ceramic-Based MLC" published in the IBM Technical Disclosure Bulletin, Volume 23, No. 12, May 1981, page 5593, tried to overcome the problems encountered in confirming dissimilar materials. The author proposes the replacement of the copper containing paste by one containing PdSi, PdP or NiP alloys. Apparently these alloys help to overcome at least partly the thermal expansion problem because they have a melting point at a temperature within the sintering temperature range. In another article with the title "Metallurgy for Multilayer Ceramic Modules" published in the IBM Technical Disclosure Bulletin, Volume 18, No. 9, Feb. 1976, page 2856, J. J. Knireck inter alia describes a method to improve inter alia the thermal coefficient of expansion match between the conductor material and the alumina ceramics in conventional multilayer ceramic modules by using Pd/Mo or Pt/Mo/Pd alloys instead of molybdenum. The addition of the Pd to Pt/Mo produces liquid phase sintering. This method reduces the risk of cracking.

It is one object of the invention to provide a glass-ceramic structure having hermetically sealed via holes.

It is a further object of the invention to provide a glass-ceramic structure with holes filled with a material of sufficient electrical conductivity.

It is another object of the invention to provide a glass-ceramic structure where said conductive material does not corrode the glass-ceramics.

It is also an object of the invention to provide a simple method for forming a glass-ceramic structure.

It is still a further object of the invention to provide a method achieving a hermetic sealing of the holes, where no excessive tensions due to different coefficients of expansion are created when the structure is heated.

BRIEF SUMMARY OF THE INVENTION

These objects are achieved by the present invention.

The adhesion between the conductive material and the glass-ceramics in the inventive structure is excellent. Though the conductive material fills the holes completely, no mechanical stress causing a bursting of the structure is built up.

One aspect of the invention relates to a glass-ceramic structure having via holes being filled with a conductive material having a TCE slightly higher than that of the glass-ceramics and having undergone liquid phase sintering at the crystallization temperature of the glass-ceramic material with the solid phase of the conductive material comprising conductive particles and the liquid phase comprising at least a glass.

Another aspect of the invention relates to a glass-ceramic structure, wherein the structure is a multilayer substrate comprising a plurality of layers of glass-ceramic material having via holes therein with at least the top and bottom layers having the via holes filled with a conductive material having a TCE slightly higher than that of the glass-ceramics and having undergone liquid phase sintering at the crystallization temperature of the glass-ceramic material with the solid phase of the conductive material comprising conductive particles and the liquid phase comprising at least a glass.

A final aspect of the invention relates to a method for forming a glass-ceramic structure comprising the steps of: providing a green sheet comprising an organic vehicle and particles of a crystallizable first glass and having via holes; filling the via holes with a paste comprising a binder and an inorganic material comprising conductive particles being solid at the sintering temperature of said first glass and particles of a second glass being low viscous at said crystallization temperature; firing the then present structure in a reducing, neutral or slightly oxidizing atmosphere with the temperature being gradually raised to said sintering temperature where said binder is removed, said first glass is crystallized and said inorganic material in said via holes undergoes liquid phase sintering with at least said conductive particles forming the solid phase and at least said second glass forming the liquid phase; and slowly cooling down the structure to room temperature.

The inventive method is not only simple but achieves also reproducible results. Using the inventive method, the throughholes in the sintered layers are completely filled or the sintered multilayer glass-ceramic substrates are hermetically sealed without the application of the expensive repair process required if the conventional method is used. Besides this difference and the application of another conductive material, the conventional method can be applied without other changes, e.g. it is possible to fire the structure in the binder-removal cycle of the sintering process in a $H_2O/H_2$ vapor atmosphere without any detrimental effects to the material in the throughholes.

BRIEF DESCRIPTION OF THE DRAWINGS

The invention will become more apparent from the following detailed description taken in conjunction with the accompanying drawings.

DETAILED DESCRIPTION OF THE INVENTION

A conventional glass-ceramic structure being used for electronics, especially microelectronics applications, comprises a glass-ceramic body consisting of glass-ceramic intermixed with glass and an electrical conductor pattern embedded in said structure having terminal portions terminating in at least one surface of the structure for electrical connection thereto. The conductor pattern may consist of conductive material deposited in the throughholes penetrating the structure in one direction and/or internal circuit pattern extending preferably perpendicular to the direction of the throughholes. In addition, a conductive pattern can be applied on at least part of the surface of the structure. Preferably (such structures are described in U.S. Pat. No. 4,301,324) the glass-ceramics is formed by heating a green sheet consisting of a binder and a crystallizable glass, like cordierite or $\beta$-spodumene, to the crystallization temperature of the glass, where in the final state, the crystalline phases formed occupy greater than 80% of the body by volume. In combination with these glasses preferably copper is used as the conductive material. Cordierite has the general formula $2\ MgO\ .\ 2\ Al_2O_3\ .\ 5\ SiO_2$ and $\beta$-spodumene has the general formula $Li_2O\ .\ Al_2O_3\ .\ 4\ SiO_2$. The electrical resistivity of copper in glass-ceramic structure is between 2.25 to 4 $\mu\Omega cm$. Its thermal expansion coefficient (TCE) is on the order of $17\times10^{-6}/°$ K. The TCE of cordierite and $\beta$-spodumene is on the order of $35\times10^{-7}/°$ K.

Because of this mismatch, in order not to cause a rupture of the structure in heating cycles, the copper does not fill the throughholes completely, rather there are small gaps between the walls of the throughholes and the copper. These gaps cause that the structure is far from being hermetically sealed. Therefore, such a structure is subject to corrosion due to penetration of humidity. In order to prevent corrosion, the gaps are filled with a polymer, like polyimide, which is brought in by an expensive and time-consuming repair process.

The inventive glass-ceramic structure differs from the known structure essentially by the conductive material used, at least in the peripheral regions of the structure. The conductive material according to the invention fills the holes in the glass-ceramic without gaps so that the polymer filling is dispensable. In order to produce such a structure, it is necessary that the TCE of the conductive material according to the invention is similar to the one of the glass-ceramic. In addition, the conductive material must have a defined, however small, closed porosity to achieve a snug fit of the conductive material in the holes of the glass-ceramic. This is necessary to compensate for the volume contraction of the conductive material during sintering.

The conductive material according to the invention comprises basically conductive particles consisting of a metal or metal compound and at least one glass which at the crystallization temperature of the glass-ceramic is low viscous. The conductive material in the inventive structure has undergone liquid phase sintering with the conductive particles forming the solid phase and the glass the liquid phase. The metal or metal compound consists of a group IVa, Va or VIa (of the periodic system) metal or a carbide of such a metal or of a mixture of such materials and most preferably of a material selected from the group W, Mo, Ti, WC, TiC, TiWC, TaC and VC. These materials have a relatively small TCE, a reasonable conductivity and a high melting point. In the following description, said particles consist always of WC which is most preferred. Preferred glasses (in weight-%) contain 50 to 80% $SiO_2$, 20 to 40% $B_2O_3$, and optionally $<1\%$ $Al_2O_3$, $<20\%$ $Na_2O$ and $<1 K_2O$ or 50 to 70% $SiO_2$, 20 to 30% $B_2O_3$, $<1\%$ $Al_2O_3$, 2 to 20% $Na_2O$ and $<1\%$ $K_2O$ or 40 to 23% $Cu_2O$, 28 to 16% $Al_2O_3$ and 31 to 60% $SiO_2$. Advantageously up to 2 mole-% of the $SiO_2$ in the glasses is replaced by SiC.

Figure 1:
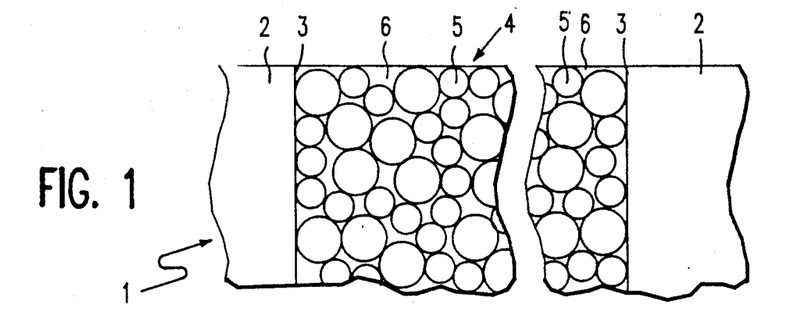
FIG. 1 is a schematic cross-section through a strongly magnified section of one embodiment of the inventive structure.

FIG. 1 shows in a highly magnified schematic cross-sectional view a section of a structure according to the invention in the form of a sheet where the conductive material contains these basic ingredients. The sheet 1 consists of a glass-ceramic material 2, like cordierite or $\beta$-spodumene, and has a throughhole 3. Throughhole 3 is filled with the conductive material 4, which consists of WC particles 5 with the interspaces filled with glass 6. Typically the WC particles have a size of maximum 20 $\mu m$ and preferably less than 15 $\mu m$. The conductive material consists preferably of about 95 to about 98.5 weight-% of the conductive particles and of about 1.5 to about 5 weight-% of glass. The TCE of the conductive material is on the order of $6.8\ .\ 10^{-6}/°$ K. and the specific resistivity is on the order of 40 $\mu\Omega$ cm.

In preferred embodiments of the inventive structure, the conductive material contains additives in the form of at least one metal not contained in the conductive particles. These additives can be present in the form of a coating of the conductive particles and/or can together with the glass fill the space intermediate the coated or uncoated conductive particles. The glass and the metallic additives form separate phases though the glass and the additives can be intimately mixed. The metallic additives are present in the form of an individual metal where the melting points of the used metals are above the applied sintering temperature or in the form of an alloy of at least two of such metals where some of the metals form an eutectic mixture with the eutectic point being below the sintering temperature. In the latter case, the alloy becomes a component of the "liquid phase" during the liquid phase sintering. All these metals form alloys. In general the metallic additives improve the electrical conductivity and the coating of the conductive particle has advantages in the preferred method, especially when the conductive particles consist of a carbide. A preferred coating for the conductive particles is nickel, cobalt, copper or combinations of two of these metals. Such a coating is applied prior to mixing the conductive particle with the glass. Other metallic additives are initially either mixed—in powder form—with the glass particles or e.g. copper, electrolessly deposited on the glass particles prior to mixing with the conductive particles and the binder. Preferred other metallic additives are silver and gold. Eutectic mixtures with the melting point below the sintering temperature are silver and copper, nickel and cobalt or gold, cobalt and copper. The alloys are formed during the sintering by interdiffusion. Preferably the amount of the conductive particles in the conductive material containing metallic additives is between about 62 and about 93 weight-%. The amount of the glass preferably is about 1 to about 5 weight-% and of the metallic additives about 6 to about 37 weight-% (about 2 to about 32 weight-%, if the conductive particles are not coated). The conductive material with such compositions has a TCE on the order of $7 \times 10^{-6}/°$ K. and is thus much closer to the one of glass-ceramic material, for example, cordierite or $\beta$-spodumene $(3.0 \times 10^{-6}/°$ K.) than the one of copper $(17 \times 10^{-6})$. The specific electrical resistivity being in the range of 14 to 24 $\mu\Omega$ cm is higher than the one of copper (3.25 to 4 $\mu\Omega$ cm) however still reasonable, especially in the embodiment of the inventive structure illustrated by FIG. 3, where the structure as illustrated in FIGS. 1 and 2 form the outer layers of a multilayer glass-ceramic substrate where the inner layers are conventially structured with the conductive material being copper.

Figure 2:
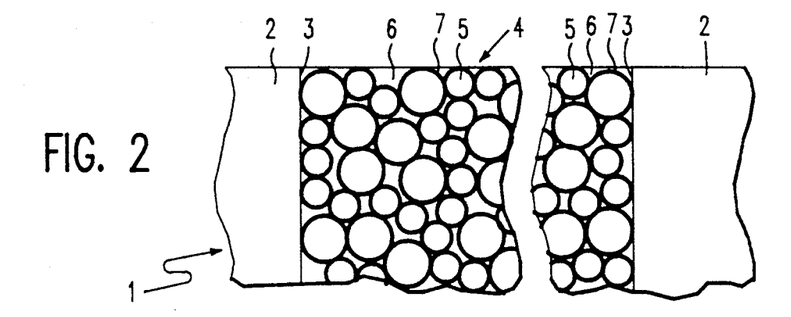
FIG. 2 is a schematic cross-section through a strongly magnified section of another embodiment of the inventive structure.

FIG. 2 shows in a schematic, highly magnified cross-sectional view a section of a second embodiment of the inventive structure where the conductive material contains said metallic additives. The sheet 1 of glass-ceramic material 2 has a throughhole 3 which is filled with conductive material 4. The conductive particles 5 are coated (numeral 7) either with nickel, cobalt or copper or with an alloy consisting preferably of copper and silver, or cobalt, gold and copper or cobalt and nickel.

A preferred embodiment of the inventive structure is a multilayer glass-ceramic substrate formed by laminating and sintering multiple glass-ceramic green sheets where the two to four bottom layers and the two to four top layers are structured according to the invention whereas the inner layers are structured conventially with throughholes containing copper as the conductive material and with conductive copper patterns being applied on at least one of the layer surfaces and being in contact with the copper in at least part of the throughholes. This structure is advantageous with respect to the conventional multilayer glass-ceramic substrate in that in the outer layers, the holes are hermetically sealed by the conductive material. This advantage is not compensated by a considerably reduced conductivity, since the copper adheres well to inventive conductive material and the relatively smaller conductivity of the inventive conductive material does not take effect, since the main part of the conductive path through the multilayer substrate is formed by copper.

Figures 3, 4:
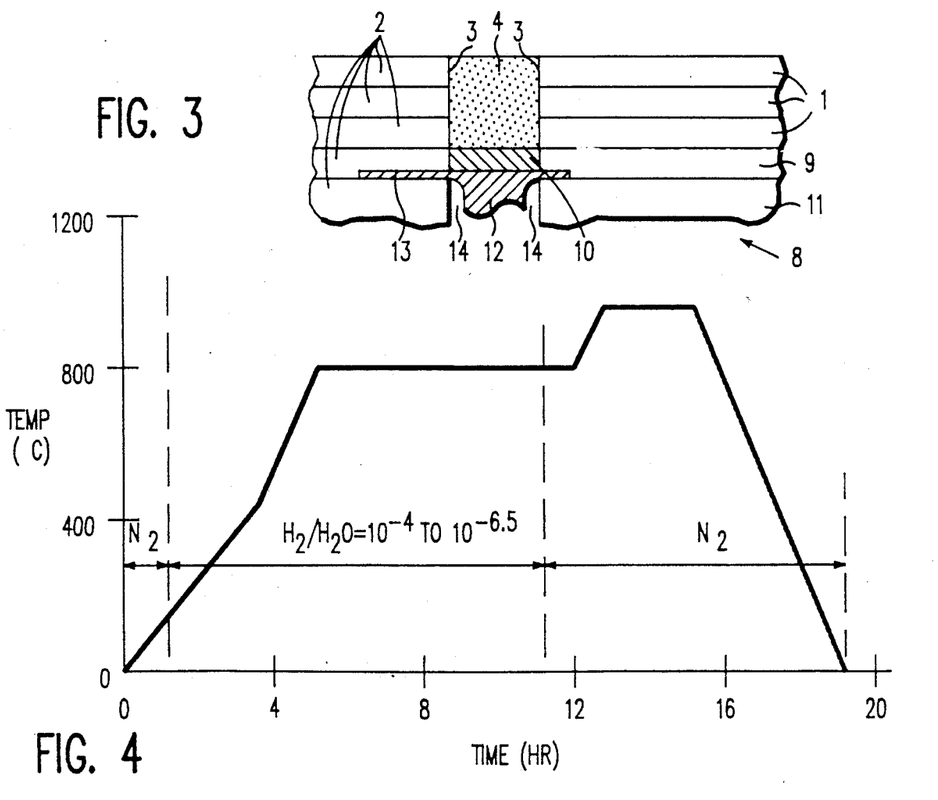
FIG. 3 is a schematic cross-section through a magnified section of a third multilayer-type embodiment of the inventive structure.
FIG. 4 is a diagram showing the sintering cycle applied in one embodiment of the inventive method.

An improvement of the structure described in the last paragraph is illustrated by FIG. 3, which shows a schematic, magnified cross-sectional view of still another embodiment of the inventive structure. FIG. 3 shows a section of the five top layers or sheets of a multilayer glass-ceramic substrate. The three top layers having the numeral 1 are layers as illustrated in FIGS. 1 and 2. These layers consist of glass-ceramic material 2 and have at least one throughhole 3 which is filled with the inventive conductive material 4. The conductive material has a composition or structure as described in connection with FIGS. 1 and 2. The fifth layer from the top with the numeral 11 is of the conventional type with the conductive material 12 in hole 3 consisting of copper which does not adhere to the glass-ceramics of the hole walls which is illustrated by gaps 14. On the upper surface of layer 11 conductive pattern 13 preferably consisting of copper is formed. Conductive pattern 13 is connected to the copper 12 in hole 3. In the space between the layer 1 and layer 11 is a layer 9 that differs from layer 11, in that the conductive material 10 in hole 3—although being copper—is porous copper. The conductivity of porous copper 10 in layer 9 is only slightly less than that of compact copper; however, its pores are plasticly deformable and can therefore help to prevent the build up of mechanical stress between the conductive material 4 and the compact copper 12 due to their different TCEs. Layer 9 is a so-called "relief-layer." In the example illustrated by FIG. 3, the structure contains only one relief-layer and three layers structured according to the invention; however, it is also possible, that a different number of relief-layers and/or layers 1 is present. FIG. 3 shows only a section of the top layer of the multilayer glass-ceramic substrate; however, it has to be understood, that the same or a similar arrangement is also available at the bottom side of the substrate. Only if such a layer arrangement is present at the top side and at the bottom side, hermetic sealed substrates are guaranteed.

Multilayer glass-ceramic substrates used for microelectronic purposes have at their upper surfaces pads for the reception of semiconductor chips and also conductive patterns for providing conductive lines to said pads. The pads and the conductive lines are not shown in FIG. 3. They are formed after the glass-ceramic substrate has passed the sintering process. Since for forming the conductive lines and the pads on the substrate surface also wet processes are applied, the hermetic sealed substrates are indispensable. If the inventive material in the holes contains a considerable amount of metal besides the conductive particles, it is in principle, possible to coat electrolytically the surfaces of the structure, that are provided with the holes, and/or to solder the pins directly to the vias.

Herein follows the description of a specific example of the structure illustrated by FIG. 3:

The structure consists of a plurality of layers each having a thickness in the order of 100 $\mu$m. The three bottom layers and the three top layers are structured according to the invention. The inner layers are of the conventional type and between the inner layers and the top and the bottom layers, respectively, a relief-layer may be inserted. The glass-ceramic material used is cordierite, consisting of 52 weight % of $SiO_2$, 21 weight % of $Al_2O_3$, 23 weight % of MgO, 1% ZnO and 1,5% of $TiO_2$ and 1.5% of $SnO_2$. The TCE of this material is about $3.1 \times 10^{-6}/°$ K. The conductive material in the outer layers having the inventive structure consists of WC particles having an average size of about 12 $\mu$m. The WC particles are coated with nickel. The glass base in the conductive material consists of 70 mol % of $SiO_2$, 25 mol % of $B_2O_3$, 1 mol % of $Al_2O_3$ and 4 mol % of $Na_2O$. The material contains also silver and copper where the copper was brought into the material by coating the glass particles with copper. The overall composition of the conductive material is 75,55 weight % of WC, 13,36 weight % of nickel, 8,32 weight % of Ag, 1,25 weight % of Cu and 1,5 weight % of glass. The specific electrical resistance of this material is 14 $\mu\Omega$ cm and the TCE is about $7.5 \times 10^{-6}/°$ K. The holes in the two relief-layers are filled with porous copper. The holes in the 20 inner layers contain copper which, however, does not fill the holes completely and each layer is equipped on either one or both surfaces with a conductive pattern consisting of copper. The overall resistivity was 5.37 $\mu\Omega$0 cm which is larger than the conductivity of the structures containing exclusively copper as a conductive material by a factor of 1.79. The structure is hermetically sealed. This was verified by the application of a fluorescent liquid which—as could be shown by a fluorescence microscope—did not penetrate into the vias.

Methods for forming conventional glass-ceramic substrates are described in U.S. Pat. 4,234,367. The starting materials for glass-ceramic substrates are crystallizable glasses, like $\beta$-spodumene or cordierite. The conventional process involves the following illustrative basic steps:

Step 1: The crystallizable glass is ground to an average particle size in the range of 2.7 $\mu$m. Already during grinding a suitable organic vehicle comprising organic binders and solvents can be added. By way of example, a suitable binder is polyvinylbutyral resin with a plasticiser such as dipropylglycol-dibenzoate. Other suitable polymers are polyvinyl formal, polyvinyl chloride, polyvinyl acetate, selected ones of the acrylic resins and the like. Similarly, other suitable plasticers such as dioctylphtalat, dibutylphtalat and the like can also be used. An easily evaporable solvent is added in order to initially dissolve the binder so as to enable it to coat the initial glass particles and adjust the rheology of the slip or slurry for good castability. A particularly effective solvent for the purpose of this example are dual solvent systems like the dual methanol/methyliso-butylketone solvent system.

Step 2: The slip or slurry prepared as in Step 1 is cast using conventional techniques into thin (e.g. about 160–220 $\mu$m) green sheets, preferably by doctor-blading techniques.

Step 3: The cast sheets are blanked to the required dimensions and via holes are punched through them in the required configuration.

Step 4: A metallizing paste of copper is extruded into the via holes in the individual sheets by means of screen-printing.

Step 5: A suitable copper paste or ink is then screen-printed onto the individual green sheets of Step 4 in the required conductor patterns.

Step 6: In case—which will be the normal situation—multilayer glass-ceramic substrates are to be formed, a plurality of sheets prepared as in Step 5 are laminated together in registry in a laminating press (the temperature and pressure employed for lamination should be such as to cause the individual green sheets to bond to each other to yield a monolithic green substrate and to cause the green ceramic to sufficiently flow and enclose the conductor patterns).

Step 7: In this step the laminate or individual green sheet is heated to the sintering temperature to accomplish binder removal, coalescence of the glass particles and conversion to a glass-ceramic by cyrstallization with concurrent sintering of the metal particles in the conductor pattern and in the via holes. Since any remaining binder residue will become entrapped in the glassy body after the glass has coalesced, the binder removal has to be correlated to the coalescence temperature of the glass particles in the range between about 800° and 875° C. It has also been found that nitrogen or any other neutral or reducing ambient make it difficult to remove the binder below the temperature of glass coalescence which can result in black or darkened substrates that are not fully sintered. Difficulties were also encountered with various neutral or reducing atmospheres, which included wet and dry nitrogen, wet and dry forming gas, long holds at a temperature below the coalescence of the glass-ceramic and alternating air and forming gas, for purposes of oxidizing carbon and reducing any formed copper-oxide to copper without drastic volume changes resulting from the copper-oxide formation. It was, however, discovered that an ambient mixture of hydrogen and water vapor in specific defined ratios can be used to oxidize carbon-containing residues of fired polymers while maintaining reducing to neutral conditions for copper. In the conventional process, the particular glass-ceramic composition chosen should be one that has an optimum sintering temperature between 50°–150° C. below the melting point of the conductor metal employed. During the firing cycle, the organic binders begin to come off at 300° C. and the binder removal is essentially complete before appreciable glass-to-glass sintering has occurred. The sintering results in the conversion of glass-to-glass-ceramic state in which the crystalline phases formed occupy >80% of the body by volume. The crystallization of glass during the sintering process counteracts the tendency of the glass to deform by viscous flow. The holding time at the sintering temperature can vary from 1 to 5 hours. The body is then cooled at a controlled rate not to exceed 4° C./minute to at least about 400° C. after which faster cooling rates may be used. Preferably the firing cycle (see FIG. 4) goes as follows: The green sheet or green laminate is preheated at a rate of 2.15° C./minute in a nitrogen ambient for about 1½ hours to a temperature of about 200° C. At this point the nitrogen is replaced by an $H_2/H_2O$ ambient in a volume ratio of $10^{-6.5}$ and the heating is continued. At about 450° C. the rate of heating is increased to about 2.9°/minute and the heating continued to a hold temperature of about 780° C. at which point the ambient is $H_2/H_2O$ at a volume ratio of $10^{-4}$ which is maintained substantially constant over the binder burn-out period (e.g. about 6 hours) before switching back to a nitrogen ambient. (It is also possible to switch to a reducing ambient). The 780° C. hold temperature is maintained for an additional 1½ hours, at which point the heating is again elevated at a rate of 2.1° C./minute to the sintering temperature of about 920° C. to about 970° C. (depending upon the glass) which temperature is held for about two hours, after which the temperature is reduced to ambient at a rate of about 3.8° C./minute. In another embodiment of the firing cycle, the switching from the $N_2$ to the $H_2/H_2O$ ambient happens already at 200° C. where during the 9½ hour duration of the $H_2/H_2O$ ambient its volume ratio is continually changed (increased) from $10^{-6.5}$ to $10^{-4}$. For further details of the described process, reference is made to U.S. Pat. No. 4,234,367.

As pointed out already, due to the very different TCEs of the glass-ceramic and the metal, like copper, in order to avoid the busting of the structure the metal cannot fill completely the holes or, in other words, the holes cannot be hermetically sealed by the metal. Since the adhesion of the copper to the glass-ceramic is not strong, in the holes are gaps between the metal and the walls of the holes. Through these gaps moisture can penetrate into the structure and cause corrosion. This might happen when the glass-ceramic substrate is used in the field; however, also already by then, when the substrate undergoes further process steps:

Preferred glass-ceramic substrates have on their upper surfaces metallic thin film patterns onto which the pattern of pads is formed to which the pads of a respective chip are soldered. To form these patterns, a thin metal film is deposited on the upper surface and then patterned by using a photolitholgraphic process as known, for example, from the semiconductor technology. The prerequisite for the application of this technique is that the surface is completely planar; therefore before the deposition of the metal, the polishing of the surface is necessary which happens in a wet environment. The conventional glass-ceramic substrates are sealed by applying an expensive repair process in which the gaps are filled with a polymer, like polyimide. This affords an hermetically sealed substrate.

Steps 1 to 3 of the inventive process for forming the inventive glass-ceramic structure are identical to Steps 1 to 3 of the conventional process, where the glass-ceramic material can be and preferably is the same as used in the conventional process.

In the inventive structure, the holes are hermetically sealed with the conductive material which is accomplished by means of liquid phase sintering in the sinter step where the glass-ceramic material is crystallized. To hermetically seal the holes while maintaining a sufficient electrical conductivity, and to make this possible by a liquid phase sintering, the paste being filled into the holes by screen-printing in Step 4 of the inventive process has to fulfil several requirements. The paste must contain at least one conductive material in the form of conductive particles, having a sufficient electrical conductivity, a melting point higher than the sintering temperature of the glass-ceramic substrate material and being resistant to the conditions of the sintering process, and at least one component that is liquid at the sintering temperature of the glass-ceramic substrate material. This last component, however, has a softening point, which is not too far below the sintering temperature, that is able to wet in a defined way the conductive particles and therefore able to condense them by liquid phase sintering where through capillary forces a reorientation of the conductive particle aggregation takes place and that is in addition able to provide a residual closed porosity in the conductive material. After the liquid phase sintering the TCE of the conductive material should be as similar as possible to the one of the glass-ceramic material.

Group IVa, Va, and VIa metals or the carbides of these metals are suitable material for the conductive particles. Preferred are tungsten, molybdenum, titanium, tungsten carbide (WC), titanium carbide, titanium tungsten carbide (TiWC), tantalum carbide and vanadium carbide with WC being the most preferred.

The component being liquid at the sintering temperature consists of at least a glass, i.e. an oxydic material. In order to distinguish this glass from the one being transformed into the glass-ceramics in the following the glass in the conductive material is designated "second glass." Such a material is favorable due to its TCE being similar to the one of the glass-ceramic material, however, not so favorable with regard to its electrical conductivity. Preferred are two types of second glass that are listed in Table I.

TABLE I

|  | Second Glass | |
|---|---|---|
|  | I (wt %) | II (wt. %) |
| $Cu_2O$ |  | 23.6–39.1 |
| $SiO_2$ | 50–80 | 32.9–59.5 |
| $B_2O_3$ | 20–40 |  |
| $Al_2O_3$ | <1 | 27.92–16.9 |
| $Na_2O$ | 0–20 |  |
| $K_2O$ | <1 |  |
| TG |  |  |

By changing the $SiO_2 : B_2O_3$, the $SiO_2 : Al_2O_3$, the $SiO_2 : Na_2O$ and/or the $B_2O_3 : Na_2O$ ratio in the second glass, the TCE and the TG (softening point) of the glass can be varied within wide ranges.

In order to increase the wettability of the second glass up to 2 mole-% of the $SiO_2$ can be replaced by silicon carbide. Silicon carbide has this effect because it is chemically more similar to the conductive particles than the silicon dioxide.

The "liquid phase" for the liquid phase sintering preferably contains a second component in the form of an eutectic metallic mixture. Such a mixture is favorable with regard to its electrical conductivity and unfavorable with regard to its TCE. In addition the eutectic mixtures facilitate to accomplish hermetic sealing of the holes. The preferred eutectic are silver and copper, nickel and cobalt and gold, cobalt and copper. The two most preferred eutectic mixtures and their respective combination ranges are listed in Table II.

TABLE II

|  | Eutectic Mixture | |
|---|---|---|
|  | I (wt. %) | II (wt. %) |
| Cu | 5–15 | 12–38 |
| Ag |  | 88–62 |
| Au | 75–85 |  |
| Co | 6–10 |  |
| Eutectic T. (°C.) | 945 | 779 |

It is favorable to coat the conductive particles with a metal, like nickel, cobalt, copper or a combination of two of these metals because it improves the sinterability of the particles and also improves the electrical conductivity and the stability of the conductive particles against oxidation and--provided they consist of carbide--decarburization in $H_2/H_2O$. Preferred coatings for WC are nickel (about 15 weight-% of the composite), cobalt (about 6 to about 15 weight-%), copper (about 5 to about 15 weight-%), an inner coating of cobalt (15 weight-%) and an outer coating of copper (about 5 weight-%) or an inner coating of nickel (about 15 weight-%) and an outer coating of cobalt (about 5 weight-%). The coating can become part of the eutectic mixtures.

The paste used for filling the throughholes in the green sheet is composed of the materials forming after sintering the conductive material and of an organic vehicle. The paste contains preferably about 80 to about 90 weight-% of inorganic material and about 10 to about 20 weight-% of the vehicle with the ratio of 86:14 being most preferred. Preferably the vehicle consists of ethylcellulose (about 85.7 weight-%), sarkosyl (about 7.1 weight-%) and thixcin (about 7.1 weight-%). Sarkosyl--being marketed by Ciba-Geigy--are higher molecular carboxylic acids (or their metal salts) of the general formula $CH_2(CH_2)n\ CON(CH_3)CF_2COOH$ and thixcin is a castor oil derivative used as a thixotropic agent and being marketed by the Kronos Titan GmbH. The inorganic material consists of the conductive particles, of e.g. WC, having a metal coating or not and having a particle size of <20 $\mu$m with preferred particle size being between 12 and 15 $\mu$m, as the constituent that is liquid or low viscous during liquid phase sintering a second glass in the form of particles having a size of between about 2 and about 5 $\mu$m, and optionally the eutectic compound in powder form or the constituents of this eutectic mixture. The constituents may e.g.—like cobalt and/or copper—be provided as the coating on the conductive particles, or—like copper, gold or silver—as an electrolessly applied coating on the glass particles or in the form of a powder. The metal, like copper, or metals intermixed with the second glass not necessarily become part of an eutectic mixture. It is within the scope of the inventive method that the metal or metals—optionally in the form of an alloy formed with each other or with the coating of the conductive particles—are a part of the inorganic material that improves the electrical conductivity but is not liquid during the liquid phase sintering. Typical compositions of the inorganic material contained in the paste with the conductive particles consisting of WC are listed in Table III.

TABLE III

| | Inorganic Material (In approx. (weight %)) | | | | | |
|---|---|---|---|---|---|---|
| | I | II | III | IV | V | VI |
| WC | 97–99 | 84–97 | 70–80 | 82–95 | 69–93 | 58–77 |
| Metal Coated on WC | | | | 4–15 (Ni) | 4–15 (Ni) | 3–12 (Ni) |
| Second Glass | 1–3 | 1–3 | 1–3 | 1–3 | 1–3 | 1–3 |
| Eutectic Mixture | | 2–15 (Au—Co Cu) | | | 2–15 (Cu—Ag) | |
| Cu | | | 17–29 | | | 17–29 |

Step 4: The described paste is extruded into the holes by a screen-printing method. Provided the now present green sheet is not included into a laminate, the next step is the firing of the green sheet.

Step 5: As in the conventional process for producing glass-ceramic substrate, the firing in the inventive process has the purpose of removing the binder or any organic material respectively and to form the glass-ceramic. In addition, the inorganic material in the holes undergoes liquid phase sintering so that at the end of the firing, the holes are hermetically sealed with the conductive material. The success of the firing depends on the interacting of materials involved and of the condition, i.e. the temperature, the cycle times and the atmosphere, during the firing. It is decisive for the firing cycle, that when the glass material coalesces or becomes soft, the binder is completely removed because remainders still present at this temperature get entrapped in the glassy body. The prior art uses basically two types of atmospheres in which the firing takes place: a neutral or reducing atmosphere (e.g. nitrogen or forming gas) or in an atmosphere that oxidizes the binder but does not oxidize copper (see the method outlined above, being described in detail in U.S. Pat. No. 4,234,367).

In the neutral or reducing atmosphere the complete removal of the binder can only be accomplished by using glasses having a high TG and long cycle times at temperatures just below said TG. $\beta$-spodumene and cordierite glasses coalesce in the temperature range between 800° and 875° C. and the effective removal of binder remainders in a nitrogen atmosphere is rather difficult below 800° C. Besides this difficulty, a neutral or reducing atmosphere has the advantages that the components of the inorganic material are not chemically effected by it. The sintering temperature of the glasses used for forming the glass-ceramic lies between 920° and 970° C. and in this temperature range the inorganic material described above forming the inventive conductive material undergoes liquid phase sintering. During the liquid phase sintering the conductive particles of, for example, tungsten carbide, are condensed by means of capillary forces, causing a reorientation of the conductive particle aggregates of the conductive material (and its electrical conductivity is increased). In addition the holes are completely filled with partly liquid material. The TCE of sintered conductive material after its solidification is essentially but not too much higher than the one of the glass-ceramic substrate. This guarantees a snug fit of the conductive material into the hole and with it a hermetic seal after room temperature has been reached, where, however, the mechanical stress is not high enough to cause the bursting of the structure.

Instead of using a neutral or reducing atmosphere during the high temperature part of binder removal, it is preferred to use an atmosphere containing water vapor and hydrogen as used in the method disclosed in U.S. Pat. No. 4,234,367 (see above). The gas mixture due to its slightly oxidizing property supports the removal of the binder by oxidizing the binder residues. The oxidizing effect of the gas mixture is not sufficient to oxidize also copper; that is why it is used in the method disclosed in U.S. Pat. No. 4,234,367. However, the oxidizing effect of the gas mixture is sufficient to oxidize the metals contained in conductive particles and also nickel and cobalt that are preferably used as coating for the conductive particles. This oxidizing effect has advantageous and disadvantageous aspects in the inventive method. One disadvantage is, certainly, that the metal in the conductive particles is oxidized. This can be partly compensated by using the respective carbide because the metals in the carbides are less subject to oxidation. However, also the carbides are affected by the gas mixture because it causes their decarburization. Therefore, when using the $H_2O/H_2$-mixture, it is in all cases recommendable, to use coated conductive particles. It is true, that the coating, if it does not consist of copper, is also subject to partial oxidation. However, this in in fact favorable because due to the oxidation of the coating there is a volume increase of the conductive material which helps to exert a considerable pressure on the walls of the holes which promotes the mechanical and also the chemical joining between the conductive material and the glass-ceramic material. The oxidation caused volume increase is revoked in the following sintering period that preferably takes place in a reducing atmosphere. The firing cycle can be conducted essentially as illustrated in FIG. 4 with the sintering/crystallization temperature being in the range between 920° and 970° C. i.e., the firing cycle of the inventive method is conducted essentially under the same conditions as applied in the method for forming the conventional glass-ceramic substrates.

In the following, two examples for forming glass-ceramic substrates according to the invention are described. In both examples conventional 180 μm thick green sheets containing β-spodumene as the glass material were formed. Subsequently holes having a diameter of about 110 μm were punched into the green sheet. The composition of the paste used in the two examples and also the specific resistance and the thermal coefficient of expansion of the sintered conductive material are listed in Tables IV and V.

TABLE IV

Example 1
Compositions in wt. %

| Ingredients | Paste | Inorganic Phase | Glassy Phase | Metallic Material |
|---|---|---|---|---|
| Inorganic Mat. | 86 | | | |
| WC—Ni | | 88.91(1) | | |
| Ag | | 8.32 | | 86.9 |
| Glassy Phase +Cu | | 2.76(2) | | |
| Glassy Phase | | | | |
| —SiO$_2$ | | | 72 | |
| —B$_2$O$_3$ | | | 23 | |
| —Al$_2$O$_3$ | | | 1 | |
| —Na$_2$O | | | 3.5 | |
| —K$_2$O | | | 0.5 | |
| —Cu | | | | 13.1 |
| Organic Mat. | 14 | | | |
| Total | 100 | 100 | 100 | 100 |
| Sintered Product | | | | |
| TCE | 7.5 · 10$^{-6}$/°K. | | | |
| R | 14μ Ω cm | | | |

(1)15 wt. % of WC—Ni is Ni
(2)45% of glassy phase +Cu consists of Cu

TABLE V

Example 2
Compositions in wt. %

| Ingredients | Paste | Inorganic Material | Glassy Phase |
|---|---|---|---|
| Inorganic Material | 86 | | |
| —WC—Ni | | 73.92$^1$ | |
| —Cu | | 23.49 | |
| Glass | | 2.59 | |
| —Cu$_2$O | | | 23.6 |
| —SiO$_2$ | | | 16.9 |
| —Al$_2$O$_3$ | | | 59.5 |
| Organic Material | 14 | | |
| Total | 100 | 100 | 100 |
| Sintered Product | | | |
| TCE | 7.6 · 10$^{-6}$/°K. | | |
| R | 24μ Ω cm | | |

$^1$15 wt. % of WC—Ni is Ni

The firing cycle was conducted according to FIG. 4 with the sintering temperature being 950° C. Up to a temperature of about 200° C. the atmosphere consisted of nitrogen, and subsequently was switched to a H$_2$O/H$_2$ with the volume ratio being 10$^{-6}$ at 400° C. and 10$^{-4}$ at 780° C. At the end of the binder burn-out the atmosphere was switched to forming gas. After sintering the formed substrate had a thickness of about 1.3 mm. The tests with the fluorescence microscope (see above) revealed, that the seal of the holes was complete with the porosity of the material being less than 10%.

In order to form laminated hermetically sealed multilayer glass-ceramic substrates with the two to four top- and bottom-layers being formed according to the invention and the inner-layer being formed conventionally with copper being the conductive material the above described process is modified in that, besides green sheets having holes filled with the conductive material according to the invention, green sheets are formed where a metallizing paste of copper is extruded into the via holes in the individual sheets by means of screen printing and a suitable copper paste or ink is then screen-printed onto the individual green sheets in the required conductor patterns. Subsequently, the formed green sheets are stacked on each other in the following order: starting with two to four sheets formed according to the invention followed by a plurality of conventional type green sheets and completing with again two to four layers of green sheets formed according to the invention. It follows a conventional laminating step and then the firing process being the same as described above.

In order to form laminated hermetically sealed multilayer glass-ceramic substrates containing a relief layer or relief layers between the layers formed according to the invention and the conventional type layer the process described in the last paragraph is modified in that in addition two or four green sheets are formed in which the holes are filled with a paste containing—besides an organic vehicle—a mixture of copper and copper oxide (CuO) with the two materials having a volume ratio of between 5:1 to 3.1 and a particle size in the range of about 2 to about 5 μm and in that these layers are inserted into the stack to be laminated before and after the conventional type layers are stacked. In the firing cycle within the temperature range between 250° C. and 700° C. the CuO is reduced, if it is exposed to H$_2$O/H$_2$-atmosphere. This reduction is connected with a volume contraction and the volume difference of the volume of the starting material is converted to a predetermined porosity of the copper via with the excellent conductivity being maintained.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. Glass-ceramic structure having via holes being filled with a conductive material having a TCE slightly higher than that of the glass-ceramic and having undergone liquid phase sintering at the crystallization temperature of the glass-ceramic material with the solid phase of the conductive material comprising conductive particles and the liquid phase comprising at least a glass.

2. Glass-ceramic structure according to claim 1 wherein the conductive particles comprise a group IVa, Va, VIa (of the periodic table) metal or a carbide of such a metal.

3. Glass-ceramic structure according to claim 2 wherein the metal or carbide is W, Mo, Ti, WC, TiC, TiWC, TaC or VC.

4. Glass-ceramic structure of claim 3 wherein the metal or carbide is WC.

5. Glass-ceramic structure according to claim 1 wherein at least a glass in the liquid phase is a glass with the main constituents being $SiO_2$, $B_2O_3$ and optionally $Na_2O$.

6. Glass-ceramic structure of claim 5 wherein part of the $SiO_2$ is replaced by SiC.

7. Glass-ceramic structure according to claim 5 wherein the glass comprises (in weight %) about 50 to about 80 $SiO_2$, about 20 to about 40 $B_2O_3$, 0 to about 1 $Al_2O_3$, 0 to about 4 $Na_2O$ and <about 1 $K_2O$.

8. Glass-ceramic structure according to claim 7 wherein up to about 2 mole % of the $SiO_2$ is replaced by SiC.

9. Glass-ceramic structure according to claim 5 wherein the glass comprises (in weight %) about 50 to about 70 $SiO_2$, about 20 to about 30 $B_2O_3$, <about 1 $Al_2O_3$, about 2 to about 20 $Na_2O$ and <about 1 $K_2O$.

10. Glass-ceramic structure according to claim 9 wherein up to about 2 mole % of the $SiO_2$ is replaced by SiC.

11. Glass-ceramic structure according to claim 1 wherein the at least a glass in the liquid phase is a glass with the main constituents being $Cu_2O$, $SiO_2$ and $Al_2O_3$.

12. Glass-ceramic of claim 11 wherein part of the $SiO_2$ is replaced by SiC.

13. Glass-ceramic structure according to claim 11 wherein the glass comprises (in weight %) about 23 to about 40 $Cu_2O$, about 32 to about 60 $SiO_2$ and about 16 to about 28 $Al_2O_3$.

14. Glass-ceramic structure according to claim 13 wherein up to about 2 mole % of the $SiO_2$ is replaced by SiC.

15. Glass-ceramic structure according to claim 1 wherein the conductive material contains an additive of a metal or metals not contained in the conductive particles which coats the conductive particles and/or is mixed with the at least one glass where the at least one glass and the additive form separate phases and wherein optionally the additive forms an eutectic mixture as a further constituent of the liquid phase.

16. Glass-ceramic structure according to claim 15 wherein said additive is Ag, Au, Co, Cu, Ni or combinations thereof, wherein said coating is Ni, Co, Cu or combinations thereof and wherein said eutectic mixture is Ag and Cu, Ni and Co or Au, Co and Cu.

17. Glass-ceramic structure, wherein the structure is a multilayer substrate comprising a plurality of layers of glass-ceramic material having via holes therein with at least the top and bottom layers having the via holes filled with a conductive material having a TCE slightly higher than that of the glass-ceramics and having undergone liquid phase sintering at the crystallization temperature of the glass-ceramic material with the solid phase of the conductive material comprising conductive particles and the liquid phase comprising at least a glass.

18. Glass-ceramic structure according to claim 17 wherein the intermediate layers have the vias filled with copper.

19. Glass-ceramic structure according to claim 18 wherein there is at least one relief layer positioned between the top and intermediate layers and the bottom and intermediate layers, the relief layers having vias filled with porous copper.

20. Method for forming a glass-ceramic structure comprising the steps of:

providing a green sheet comprising an organic vehicle and particles of a crystallizable first glass having a crystallization temperature and having via holes, filling the via holes with a paste comprising a binder and an inorganic material comprising conductive particles being solid at the sintering temperature of said first glass and particles of a second glass being low viscous at said crystallization temperature, firing the then present structure in a reducing, neutral or slightly oxidizing atmosphere with the temperature being gradually raised to said sintering temperature where said binder is removed, said first glass is crystallized and said inorganic material in said via holes undergoes liquid phase sintering with at least said conductive particles forming the solid phase and at least said second glass forming the liquid phase; and slowly cooling down the structure to room temperature.

21. Method according to claim 20, wherein the conductive particles comprise a group IVa, Va, VIa (of the periodic table) metal or a carbide of such a metal.

22. Method according to claim 21 wherein the metal or carbide is W, Mo, Ti, WC, TiC, TiWC, TaC or VC.

23. Method of claim 22 wherein the metal or carbide is WC.

24. Method according to claim 20 wherein the second glass is a glass with the main constituents being $SiO_2$, $B_2O_3$ and optionally $Na_2O$.

25. Method of claim 24 wherein part of the $SiO_2$ is replaced by SiC.

26. Method according to claim 24 wherein the glass comprises (in weight %) about 50 to about 80 $SiO_2$, about 20 to about 40 $B_2O_3$, 0 to about 1 $Al_2O_3$, 0 to about 4 $Na_2O$ and <about 1 $K_2O$.

27. Method according to claim 26 wherein up to about 2 mole % of the $SiO_2$ is replaced by SiC.

28. Method according to claim 24 wherein the glass comprises (in weight %) about 50 to about 70 $SiO_2$, about 20 to about 30 $B_2O_3$, <about 1 $Al_2O_3$, about 2 to about 20 $Na_2O$ and <about 1 $K_2O$.

29. Method according to claim 28 wherein up to about 2 mole % of the $SiO_2$ is replaced by SiC.

30. Method according to claim 20 wherein the second glass is a glass with the main constituents being $Cu_2O$, $SiO_2$ and $Al_2O_3$.

31. Method of claim 30 wherein part of the $SiO_2$ is replaced by SiC.

32. Method according to claim 30 wherein the glass comprises (in weight %) about 23 to about 40 $Cu_2O$, about 32 to about 60 $SiO_2$ and about 16 to about 28 $Al_2O_3$.

33. Method according to claim 32 wherein up to about 2 mole % of the $SiO_2$ is replaced by SiC.

34. Method according to claim 20 wherein to said inorganic material an additive of a metal or metals not being contained in the conductive particles is mixed with said particles of said second glass.

35. Method according to claim 34 wherein said additive is coated on said second glass particles.

36. Method according to claim 34 wherein said additive is added in the form of an eutectic mixture being liquid or low viscous respectively in the liquid sintering step and/or the additive is added in the form of a mixture of two or three metals that form an eutectic mixture being liquid or low viscous respectively during the liquid phase sintering.

37. Method according to claim 20 wherein to said inorganic material an additive of a metal or metals not being contained in the conductive particles is coated on the conductive particles.

38. Method according to claim 34 wherein said additive is cobalt, copper, gold, nickel or silver.

39. Method according to claim 36 wherein the eutectic mixture or its precursors are composed of silver and copper or copper, cobalt and gold or cobalt and nickel.

40. Method according to claim 37 wherein said additive is nickel, cobalt, copper or combinations thereof.

41. Method according to claim 34 wherein said paste comprises about 10 to about 20 weight-% of said binder and about 80 to about 90 weight-% of said inorganic material with said inorganic material comprising about 62 to about 98.5 weight-% of conductive particles and about 1.5 to about 5 weight-% of said second glass with the remainder being said additive.

42. Method according to claim 37 wherein said paste comprises about 10 to about 20 weight-% of said binder and about 80 to about 90 weight-% of said inorganic material with said inorganic material comprising about 62 to about 98.5 weight-% of conductive particles and about 1.5 to about 5 weight-% of said second glass with the remainder being said additive.

43. Method according to claim 20 wherein said sintering temperature lies in the range between about 800° C. and about 970° C.

44. Method according to claim 20 wherein binder removal is performed in an $H_2O/H_2$ atmosphere.

45. Method according to claim 20 wherein prior to the firing the following steps are inserted:
   stacking in registration a predetermined number of said green sheets having said second glass,
   continuing the stacking in registration with a predetermined number of green sheets not having said second glass,
   completing the stacking in registration with a predetermined number of green sheets having said second glass, and
   laminating the stack by the application of heat and pressure.

46. Method according to claim 45, wherein prior to continuing the stacking and prior to completing the stacking, at least one additional green sheet having a paste comprising an organic vehicle and a mixture of Cu and $Cu_2O$ in a predetermined volume ratio is inserted into the stack, wherein upon sintering said Cu and $Cu_2O$ mixture forms porous copper.

* * * * *